United States Patent [19]

Mahony

[11] 4,359,728

[45] Nov. 16, 1982

[54] METHOD AND MEANS FOR MINIMIZING DISTORTION IN TELEVISION DISPLAY

[75] Inventor: John E. Mahony, Sacramento, Calif.

[73] Assignee: General Electric Company, Rancho Cordova, Calif.

[21] Appl. No.: 203,657

[22] Filed: Nov. 3, 1980

[51] Int. Cl.³ .............................................. G09G 1/16
[52] U.S. Cl. ..................................... 340/747; 340/728
[58] Field of Search ............... 340/722, 726, 728, 747, 340/723, 744

[56] References Cited

U.S. PATENT DOCUMENTS

| | | | |
|---|---|---|---|
| 2,921,124 | 1/1960 | Graham | 340/728 |
| 4,023,165 | 5/1977 | Holt et al. | 340/722 |
| 4,119,956 | 10/1978 | Murray | 340/728 |
| 4,263,593 | 4/1981 | Dagostino et al. | 340/728 |

Primary Examiner—Marshall M. Curtis
Attorney, Agent, or Firm—Flehr, Hohbach, Test, Albritton & Herbert

[57] ABSTRACT

Distortion is minimized in displaying a waveform on a television display where the wave is identified by sequential magnitude points. The midpoint between consecutive magnitude points is determined, and raster line points in the television display are illuminated along the vertical axis from each magnitude point to the adjacent midpoint thereby minimizing the box-like image of complex waves.

6 Claims, 6 Drawing Figures

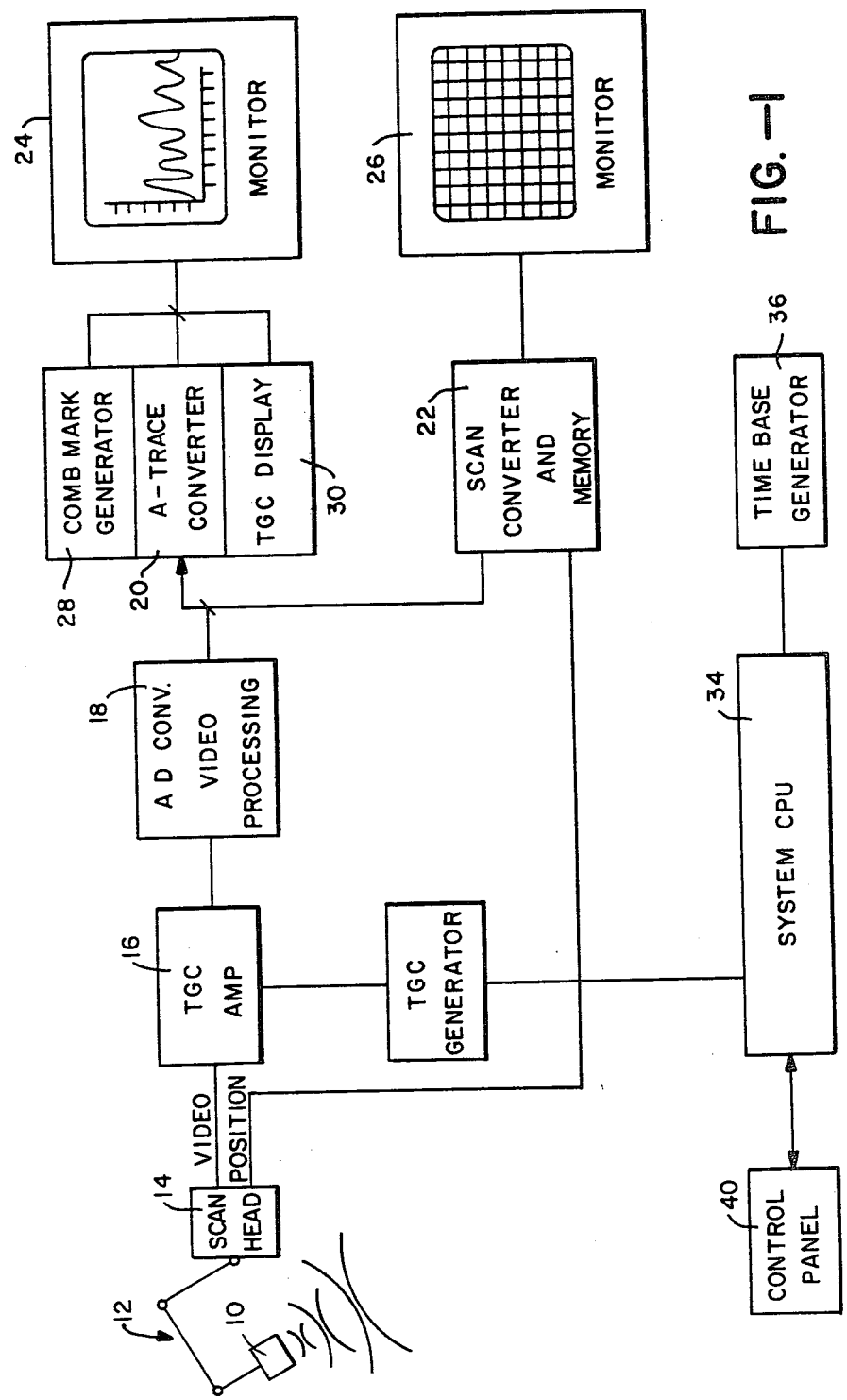
FIG.—1

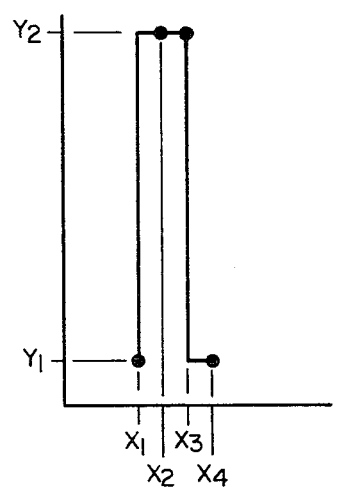
FIG.—2
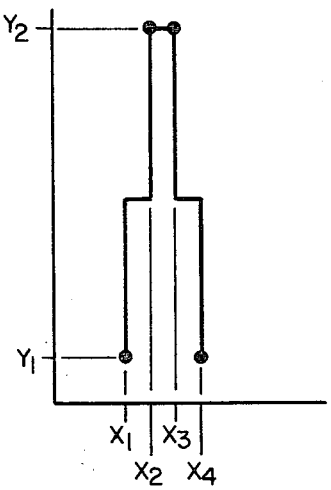
FIG.—3
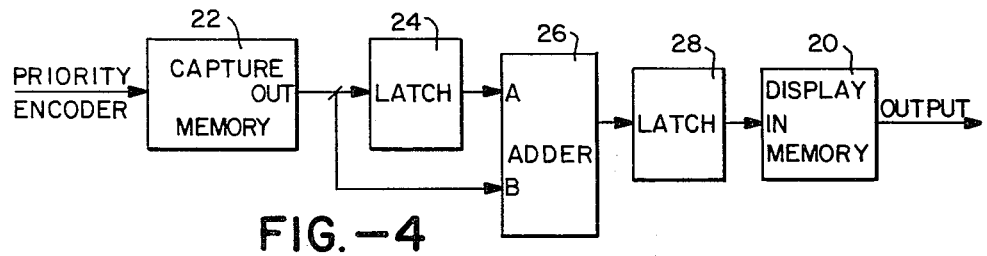
FIG.—4
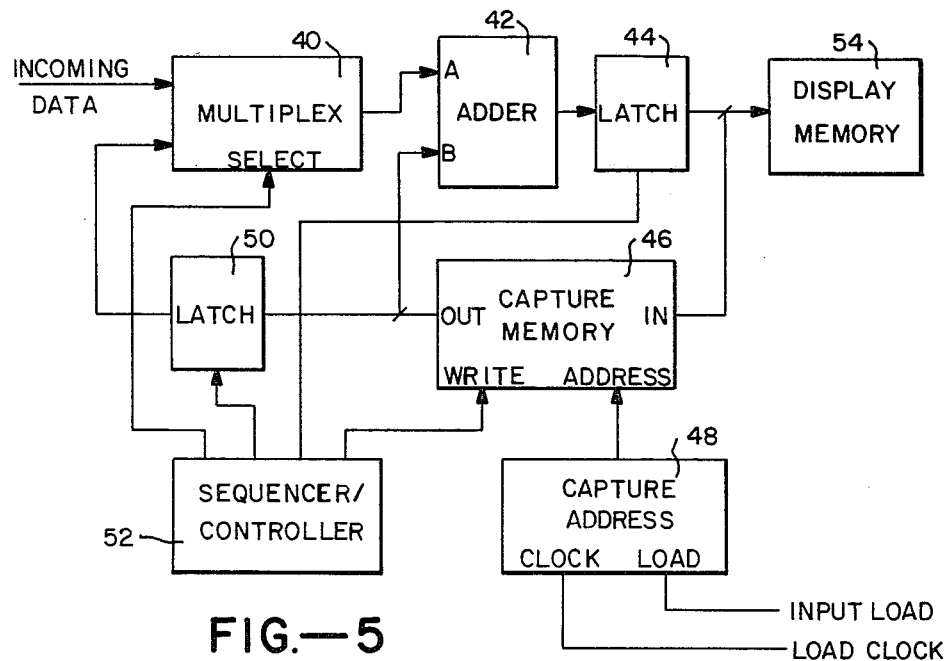
FIG.—5

METHOD AND MEANS FOR MINIMIZING DISTORTION IN TELEVISION DISPLAY

This invention relates generally to television displays such as used in ultrasonic scanners, and more particularly the invention relates to method and means for minimizing distortions in a television display.

Ultrasonic scanning systems are known and commercially available for medical diagnostic purposes. See for example U.S. Pat. No. 4,172,386 for "Video A Trace Display System for Ultrasonic Diagnostic System" and U.S. Pat. No. 4,204,433 for "Computerized Ultrasonic Scanner With Technique Select". The commercially available Datason ultrasonic system of General Electric Company provides an A trace display along with both real time and static images on a television display.

Briefly, such systems utilize sound transducers to transmit ultrasonic (e.g. on the order of several megahertz) waves into a patient and to receive echo signals. In one mode of operation, the transducer is attached to a plurality of hinged arms for movement in a single plane, and potentiometers associated with the hinged arms produce signals which identify the transducer in position. Alternatively, a hand held transducer or a linear transducer array can be employed. The echo signals are applied to a variable gain amplifier to adjust the echo signals for attenuation when passing through the patient. The adjusted signals are then passed through an analog to digital conversion and video processing circuitry and thence either to standard converter circuitry for controlling the body scan display or to A trace conversion circuitry for graphically depicting the ultrasonic pulse echo. The echo amplitude is graphically represented as the ordinate value, while the echo return time (indicative of body depth) is reproduced on the abscissa. Accordingly, by viewing the A trace one may determine the depth into the body of each discontinuity in the pulse propagation path and the type of media transition.

An X-Y oscilloscope can be used for displaying the A trace, and use of an oscilloscope offers advantages in displaying complex waveforms. However, oscilloscopes are expensive and do not have the flexibility of television monitors in displaying alpha numeric data. Further, a television monitor can be readily used with video tape and several television monitors can be driven in parallel. A major limitation of the television monitor is the representation of complex waveforms. For example, in connecting two points on a display the oscilloscope will project a line directly connecting the two points. The television display, however, draws a vertical segment from the first point and then a horizontal segment to the second point. The resulting curves can be distorted and difficult to interpret.

Accordingly, an object of the present invention is an improved method of controlling a television display for interconnecting points.

Another object of the invention is apparatus for controlling raster illumination for an improved image in a television monitor.

Yet another object of the invention is a reduction of noise content in a television display.

Briefly, in accordance with the invention two points are interconnected in a television display by identifying the mid-point or crossover point between the two points along one axis and extending lines from the two points along the axis to the crossover point. In a TV display system in which raster line illumination control is stored as digital data in a display memory, the raster line illumination for interconnecting two points identified by coordinates along two axes includes identifying the mid-point along one axis between the two points, storing raster line illumination data for raster lines extending along the one axis from the first of the two points to the mid-point, and storing raster illumination data for raster lines extending along the one axis from the other of the two points to mid-point. Thus, rather than displaying one continuous line along the axis, two offset lines are displayed with the offset providing an improved image.

In such a TV display system, the apparatus for controlling raster line illumination in accordance with the invention includes a first memory for receiving and storing data identifying senquential points of a curve to be displayed. First means is interconnected with the first memory for deriving the mid-point along one axis between the adjacent points. A second means interconnects the first means with a second or display memory for storing raster line illumination data for raster line points extending along one axis from the other of the two points to the mid-point. The first means comprises an adder for receiving and adding the value of one point along one axis and the value of the adjacent point along the one axis and means for dividing the sum by two.

The invention and objects and features thereof will be more readily apparent from the following detailed description and appended claims when taken with the drawing, in which:

FIG. 1 is a functional block diagram of an ultrasonic scanner system and A trace monitor in which the present invention is applicable.

FIG. 2 is a graphic representation of the display of the curve in a TV monitor.

FIG. 3 is a graphic representation of the display of the curve of FIG. 2 in accordance with the present invention.

FIG. 4 is a functional block diagram of one embodiment of apparatus in accordance with the invention.

FIG. 5 is a functional block diagram of an alternative embodiment of the present invention.

Figure 6:
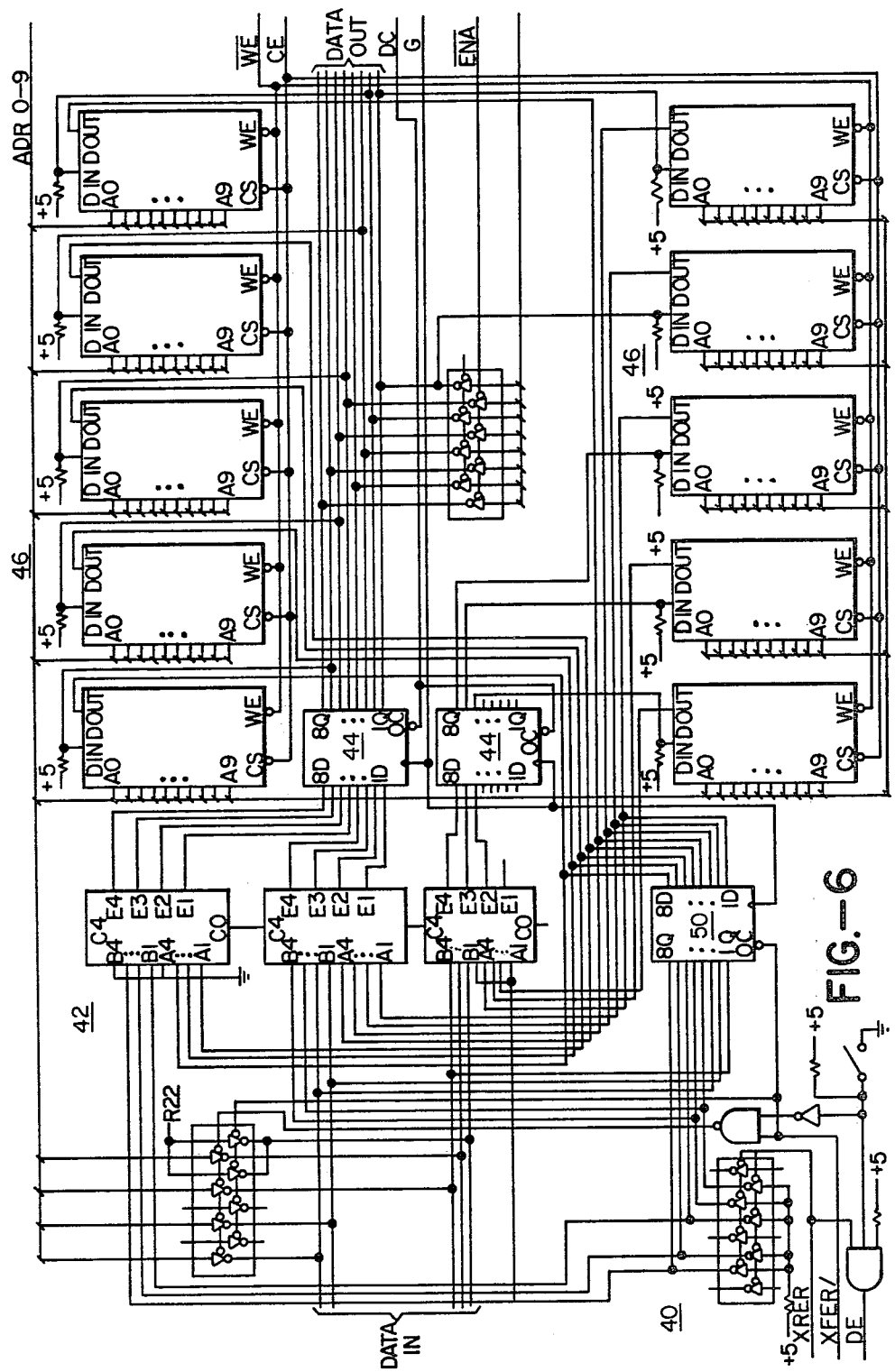
FIG. 6 is a schematic diagram of another embodiment of the invention.

Referring now to the drawings, FIG. 1 is a functional block diagram of an ultrasonic scanner. In this embodiment the system includes a transducer 10 mounted on a hinged arm system shown generally at 12 whereby transducer 10 can move freely in a single plane. Potentiometers in scanhead 14 and associated with the arms of the system generate signals indicative of the X and Y position of the scanner 10 in the plane of motion.

Transducer 10 transmits ultrasonic signals (e.g. on the order of 2 megahertz) and generates electrical signals in response to reflections of the transmitted ultrasonic signals. The generated signals are attenuated in time due to attenuation of the ultrasonic signal in passing through a patient.

The attenuated video signal is then applied to a variable gain amplifier 16, and the amplified signal is then applied to analog to digital conversion and video processing circuitry 18. The output of circuitry 18 is then applied to A trace converter circuitry 20 and to scan converter and memory circuitry 22 which generate the signals for controlling television monitors 24 and 26, respectively.

The A trace converter generates a signal for real time display of the amplitude of each reflected ultrasonic wave. The A trace data applied to monitor 24 identifies a horizontal position on the monitor (e.g. 1,000 positions) and an amplitude or vertical position associated with each X position. This data controls the intensity of the electron beam in the display during raster line scanning by the beam. Scale markings for the displayed A trace are generated by comb mark generator 28, and a time gain compensation curve is provided by generator 30.

A section view of the patient is displayed on monitor 26 in response to the scan converter and memory 22. The signal from circuitry 18 is converted for storage in a 512×512 memory matrix with each point in the matrix accommodating a 5 bit brightness code. The matrix corresponds to the pixels on the display of monitor 26 with the brightness code being indicative of the Grayscale for the pixels.

System control is provided by a central processing unit 34 which also controls a time base generator 36 which generates the timing signals for the system. A time gain compensation (TGC) control generator 38 generates the control signals for amplifier 16 and a control panel 40 is provided for manual control of the system through the central processing unit.

In a video A trace display system as described in U.S. Pat. No. 4,172,386, supra, data for controlling the illumination of raster scan lines in the TV display are stored in a memory having a plurality of addresses corresponding to increments of the raster scan lines of the television display with the data indicating video signal magnitude at each increment. For example, each raster line may be defined by 1,000 addressable positions. Thus, the contents of the memory can be read out during each raster line scan in the sequence in which they were stored. The data is converted to an intensity modulated signal in a format compatible with the raster line scan of the video beam whereby a video display of the A trace is produced.

Heretofore, in displaying a line between two adjacent points of the A trace curve, raster illumination data is stored for raster lines extending along one axis from the first data point to the level of the second data point. However, as above described, the image of a complex waveform is distorted and often difficult to interpret.

In accordance with the present invention, an improved image is projected for a complex wave by illuminating a first line segment extending from the one point to the mid-point or crossover point between the two data points, and extending a second line segment from the second data point to the crossover point. FIGS. 2 and 3 are respectively graphic illustrations of a simple curve as conventionally displayed and as displayed in accordance with the invention. Referring to FIG. 2, four sequential data points are identified by the coordinates $(X_1,Y_1)$ $(X_2,Y_2)$ $(X_3,Y_2)$ $(X_4,Y_1)$. Conventionally, the raster points extending vertically from the point $(X_1,Y_1)$ to the point $(X_1,Y_2)$ would be illuminated, the horizontal raster line segment between the point $(X_1,Y_2)$ and the point $(X_3,Y_2)$ would be illuminated. The vertical raster points extending downwardly from $(X_3,Y_2)$ to the point $(X_3,Y_1)$ would be illuminated thereby producing a rectangular image. In FIG. 3 the display is illuminated in accordance with the present invention. The midpoint or crossover point between the point $(X_1,Y_1)$ and the point $(X_2,Y_2)$ is determined and the vertical raster points extending from the point $(X_1,Y_1)$ to the crossover point are illuminated. The vertical raster points extending from the point $(X_2,Y_2)$ to the crossover point are illuminated, also. Similarly, the crossover point between the point $(X_3,Y_2)$ and the point $(X_4,Y_1)$ is determined, and the vertical points extending from the point $(X_3,Y_2)$ to the crossover point are illuminated along with the vertical points extending from the point $(X_4,Y_1)$ to the crossover point. The resulting image has some semblance of slope as opposed to the boxlike image of FIG. 2.

FIG. 4 is a functional block diagram of one embodiment of apparatus in accordance with the invention which can be employed in the system disclosed in U.S. Pat. No. 4,172,386. As disclosed in the patent, the contents of a display memory are read out during every video line in the sequence in which they were stored and converted to an intensity modulated signal in a format compatible with the raster scan of the video beam to thereby produce the A trace. The stored data identifies the magnitude of the A trace at a plurality of points in time. In the patent the memory is stored with data words directly from the priority encoder. However, as shown in FIG. 4, interconnected between the priorty encoder and the display memory 20 is a capture memory 22 which receives the amplitude values or data words from the priority encoder at successive data points. The digital data defining signal magnitude and stored at a plurality of addresses are applied through a latch 24 to an adder 26. The output of capture memory 22 is also connected directly to one input of adder 26. Adder 26 sums and averages the values of two successive data words, and the average value is then applied through a latch 28 to the display memory 20.

FIG. 5 is another embodiment of the circuitry of the invention as has been implemented for the Datason system. In this system incoming data from the priorty encoder is applied through a multiplexer 40, adder 42, and latch 44 to the capture memory 46, and to display memory 54. During the capture process adder 42 is deactivated and the incoming data is stored in memory 46 without modification. A capture address generator 48 controls the addressing of the capture memory 46 as the incoming data is written into memory.

After the capture process is complete, data from the capture memory 46 is applied through latch 50 and multiplexer 40 to one input of the adder 42. The sequencer controller 52 effects the proper timing of the sequence operation and the control of multiplexer 40. The output of capture memory 46 is applied also directly to the adder 42 whereby two sequential data words are summed, and the average value representing the crossover point between the two data words is then applied through latch 44 for storage in the display memory 54.

FIG. 6 is a more detailed schematic illustrating the implementation of the circuitry of FIG. 5 in the Datason system. The same elements in the two Figures have the same reference numerals and the commercially available products are indicated in parentheses. Initially, the incoming data is stored in the capture memory 46 comprising 10 1K random access memories (Intel 2125). After the capture operation, the data is taken from the capture memory 46 and applied through latch 50 (National LS 374) and also the adder 42 comprising the three 4 bit adders (National S283) which are interconnected to operate on two 5 bit data words and produce an average value as an output to latch 44 comprising two 8 bit latches (National S373). This data is then stored in the display memory 54 (not shown) in sequence for controlling the raster scans of the display monitor. The capture address generator 48 (not shown) responds to the Datason A trace load clock and sync signal during the capture operation to store the incoming data in the capture memory in a similar manner to the storage of data in the display memory 54. The sequencer controller responds to a capture signal and load signal for respectively controlling the writing in capture memory 46 and the transfer of data from memory 46 through latch 50 and multiplexer 40 back to the adder 42.

The display of complex waveforms in a television monitor in accordance with the present invention produces an improved image with smoother line segments and facilitates analysis of the waveform. While the invention has been described with reference to a specific embodiment, the description is illustrative of the invention and is not be construed as limiting the invention. Various modifications and applications may occur to those skilled in the art without departing from the true spirit and scope of the invention as defined by the appended claims.

What is claimed is:

1. In a television display system in which video magnitude data is stored as digital data in a display memory for control of the television display, a method of controlling raster line display illumination for interconnecting first and second points identified by coordinates along two axes comprising the steps of identifying the midpoint along one axis between said first and second points, storing midpoint data for illuminating raster line points extending along said one axis between said first point and said midpoint, and storing data of said second point for illuminating raster line points extending along said one axis between said midpoint and said second point.

2. The method in accordance with claim 1 wherein said step of identifying said midpoint comprises adding the value of said first point on said axis and the value of said second point on said axis and dividing the sum by two.

3. The method as defined by claim 1 or 2 wherein data along said one axis denotes magnitude and said magnitude data in said memory corresponds to the raster lines in said display and addresses of said memory correspond to points on each raster line.

4. In a television display system in which video magnitude is stored as digital data in a display memory, apparatus for controlling raster line illumination for interconnecting two points identified by coordinates along two axes of a television display comprising a first memory for receiving and storing data identifying sequential points of a curve, first means interconnected with said first memory means for deriving the midpoint along one axis between adjacent points, a second memory, and second means interconnecting said first means and said second memory for storing raster line illumination data for raster line points extending along said one axis between a first of said two points and said midpoint and storing raster line illumination data extending along said one axis between the other of said two points and said midpoint.

5. Apparatus as defined by claim 4 wherein said first means comprises an adder for receiving and adding the value of one point along said one axis and the value of an adjacent point along said one axis and means for dividing the sum by two.

6. Apparatus as defined by claim 4 or 5 wherein said first and second memory each includes addressable locations corresponding to a plurality of locations along each raster line scan and said raster line illumination data comprises the data along said one axis.

* * * * *